United States Patent
Fan et al.

(10) Patent No.: US 8,120,920 B2
(45) Date of Patent: Feb. 21, 2012

(54) COMPUTER SYSTEM WITH HEAT SINK

(75) Inventors: Chen-Lu Fan, Taipei Hsien (TW);
Li-Ping Chen, Taipei Hsien (TW);
Yi-Lung Chou, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 208 days.

(21) Appl. No.: 12/712,300

(22) Filed: Feb. 25, 2010

(65) Prior Publication Data
US 2011/0110030 A1    May 12, 2011

(30) Foreign Application Priority Data

Nov. 9, 2009    (CN) .......................... 2009 2 0314398

(51) Int. Cl.
*H05K 7/20*    (2006.01)
*F28F 7/00*    (2006.01)
*H01L 23/34*    (2006.01)

(52) U.S. Cl. ........ 361/719; 165/80.2; 165/185; 257/719
(58) Field of Classification Search .................. 257/719; 361/719
See application file for complete search history.

(56) References Cited

U.S. PATENT DOCUMENTS

| | | | | |
|---|---|---|---|---|
| 5,850,691 | A * | 12/1998 | Bell | 29/845 |
| 6,549,410 | B1 * | 4/2003 | Cohen | 361/704 |
| 6,717,815 | B2 * | 4/2004 | Yang | 361/719 |
| 6,859,367 | B2 * | 2/2005 | Davison | 361/704 |
| 7,042,719 | B2 * | 5/2006 | Lai | 361/679.21 |
| 7,042,727 | B2 * | 5/2006 | Ulen et al. | 361/704 |
| 7,443,682 | B2 * | 10/2008 | Fan et al. | 361/709 |
| 7,929,309 | B2 * | 4/2011 | Zhao et al. | 361/719 |
| 7,961,473 | B1 * | 6/2011 | Bohannon et al. | 361/719 |
| 7,986,529 | B2 * | 7/2011 | Lee et al. | 361/719 |
| 2005/0068740 | A1 * | 3/2005 | Ulen et al. | 361/719 |
| 2007/0274048 | A1 * | 11/2007 | Xia et al. | 361/704 |

* cited by examiner

*Primary Examiner* — Gregory Thompson
(74) *Attorney, Agent, or Firm* — Altis Law Group, Inc.

(57) ABSTRACT

A computer system includes a chassis, a motherboard secured to the chassis, and a heat sink. A chip is mounted on the motherboard. A securing component secured to the motherboard adjacent the chip. The securing component defines an opening. Two positioning posts are located on the motherboard and adjoin two opposite edges of the opening. Each positioning post defines a fastener hole. A heat sink includes a main body and a fin portion located on the fin portion. The main body defines two through holes. The main body defines two recesses to expose the through holes. The heat sink is secured to the securing component, by two fasteners engaged in the through holes and the fastener holes.

19 Claims, 2 Drawing Sheets

COMPUTER SYSTEM WITH HEAT SINK

BACKGROUND

1. Technical Field

The present disclosure relates to a computer system with a heat sink.

2. Description of Related Art

A heat sink is secured to a motherboard of a computer system, by a plurality of fasteners, for cooling a chip mounted on the motherboard. The fasteners are usually fixed around the heat sink. This increases the amount of space needed for securing the heat sink.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
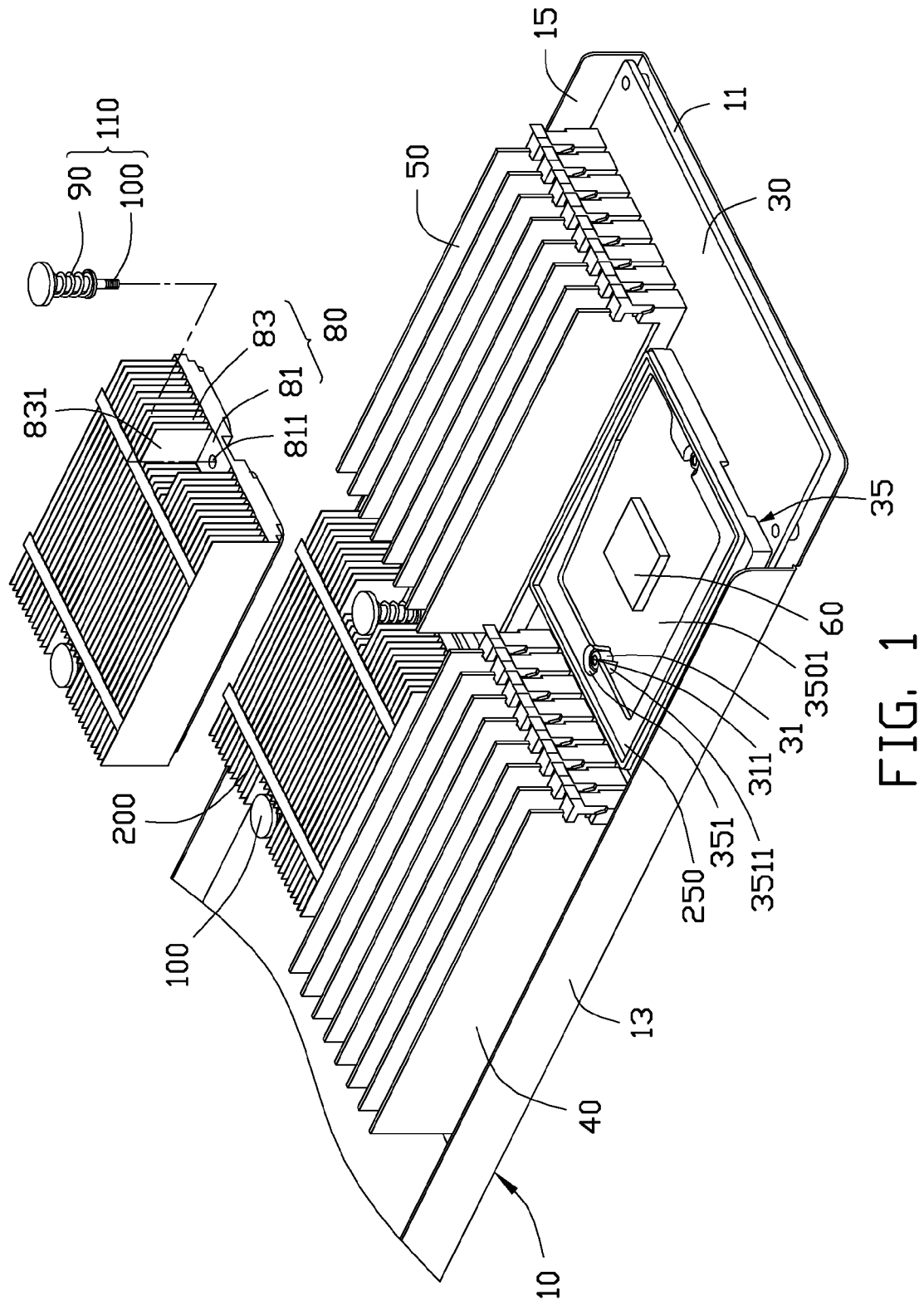
FIG. 1 is a partially exploded, isometric view of a computer system in accordance with an exemplary embodiment.

Referring to FIG. 1, a computer system in accordance with an exemplary embodiment includes a chassis 10, a motherboard 30, two groups of memory cards 50, and two heat sinks 80.

The chassis 10 is configured for receiving the motherboard 30, and includes a bottom wall 11, a first sidewall 13, and a second sidewall 15. In one exemplary embodiment, the first sidewall 13 and the second sidewall 15 are substantially perpendicular to the bottom wall 11, and the second sidewall 15 is substantially parallel to the first sidewall 13.

The motherboard 30 is capable of being secured to an inner surface of the bottom wall 11 of the chassis 10. Two chips 60, such as CPUs, are secured to the motherboard 30. Two securing components 35 are located on the motherboard 30. In one exemplary embodiment, each securing component 35 surrounds each chip 60. Each securing component 35 includes a top wall 250, which is substantially parallel to the chassis bottom wall 11. The top wall 250 defines an opening 3501. The positioning holes 351 are defined in the top wall 250 adjacent opposite edges of the opening 3501. Each positioning hole 351 communicates with the opening 3501. A flange 3511 extends downward from an edge of each positioning hole 351. In one exemplary embodiment, the edge of each positioning hole 351 is arcuate, and the flange 3511 is arcuate and substantially close to the motherboard 30. Two positioning posts 31 are located on the motherboard 30 and correspond to the positioning holes 351. In one exemplary embodiment, the positioning posts 31 are surrounded by the flanges 3511 respectively. A fastener hole 311 is defined in each positioning post 31.

Each group of memory cards 50 is located on the motherboard 30 and positioned between the two securing components 35.

Each heat sink 80 includes a main body 81 and a fin portion 83 located on the main body 81. Two through holes 811 are defined in the main body 81 adjacent opposite edges. In one exemplary embodiment, the fin portion 83 includes a plurality of substantially parallel fins 200. Two recesses 831 are defined in the fin portion 83 to expose the through holes 811 of the main body 81.

Figure 2:
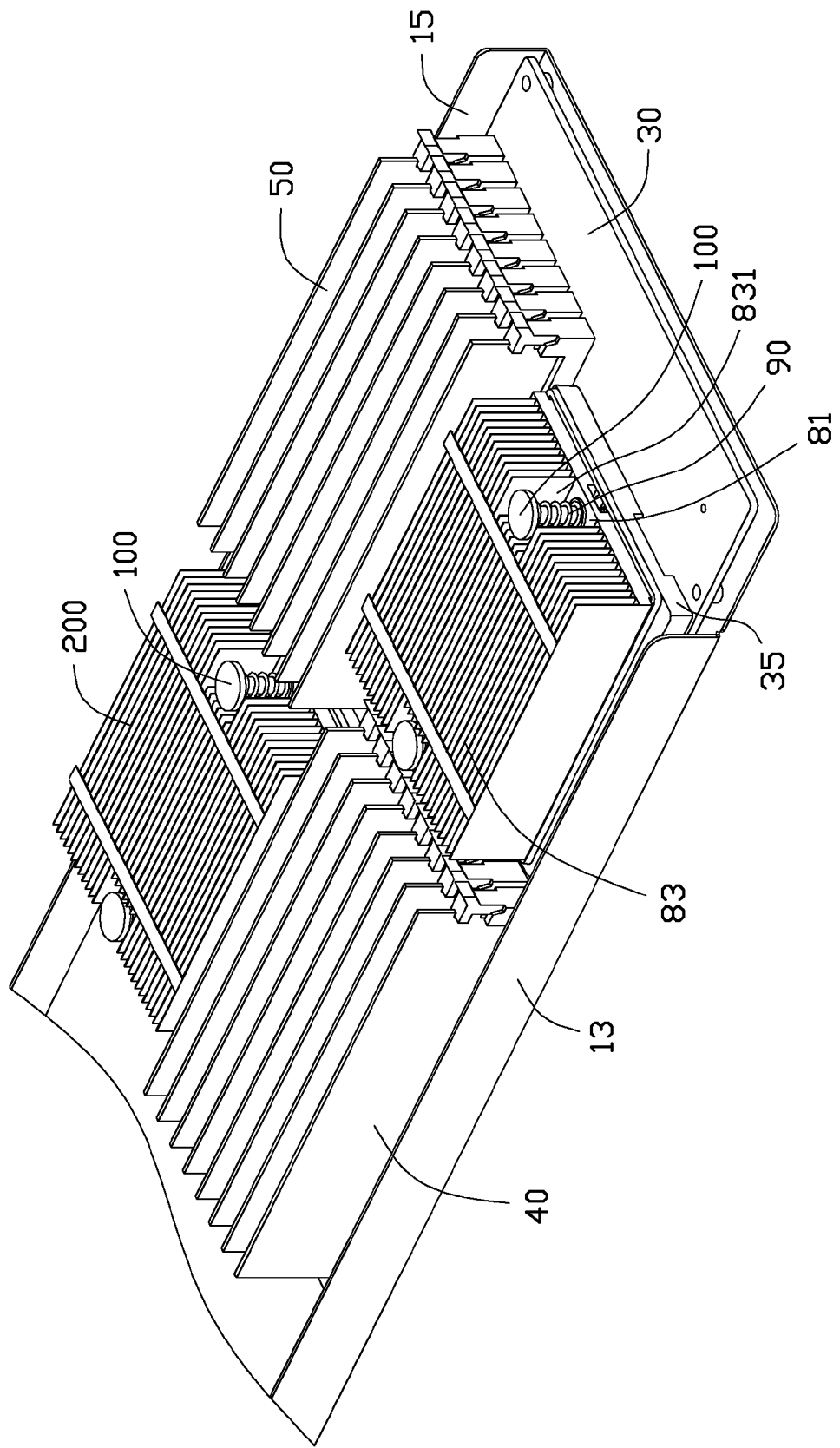
FIG. 2 is an assembled view of the computer system of FIG. 1.

Referring also to FIG. 2, in assembly, each heat sink 80 is placed on each securing component 35. The through holes 811 of the heat sink 80 are aligned with the fastener holes 311 for the positioning posts 31. Two fasteners 100 are screwed in the through holes 811 and the fastener holes 311 via the recesses 831, to secure the heat sinks 80 to the securing components 35. The fasteners 100 are positioned in the recesses. The heat sinks 80 can therefore cool the chips 60.

In one exemplary embodiment, each fastener 100 includes a bolt 110 and a spring 90 surrounding the bolt 110. When each fastener 100 secures the heat sink 80 to the securing component 35, the spring 90 is resiliently deformed to press the main body 81 of the heat sink 80. The springs 90 are positioned in the recesses 831, for preventing the fasteners 100 from loosening.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A computer system comprising:
   a chassis;
   a motherboard secured to the chassis; a chip mounted on the motherboard; a securing component secured to the motherboard adjacent the chip; the securing component defining an opening; two positioning posts located on the motherboard and adjoining two opposite edges of the opening; each positioning post defining a fastener hole; and
   a heat sink comprising a main body and a fin portion located on the main body; the main body defining two through holes; the fin portion defining two recesses to expose the through holes; wherein
   the heat sink is secured to the securing component, by two fasteners engaged in the through holes and the fastener holes.

2. The computer system of claim 1, wherein the securing component surrounds the chip.

3. The computer system of claim 1, wherein the securing component defines two positioning holes; and the positioning posts are located in the positioning holes.

4. The computer system of claim 3, wherein a flange extends from an edge of each positioning hole.

5. The computer system of claim 4, wherein the flange is adjacent the motherboard.

6. The computer system of claim 4, wherein the flanges surround the positioning posts.

7. The computer system of claim 3, wherein each positioning hole communicates with the opening.

8. The computer system of claim 1, wherein each fastener comprises a bolt and a spring surrounding the bolt; and the springs are located in the recesses.

9. The computer system of claim 8, wherein the springs are resiliently deformed to press the main body of the heat sink.

10. The computer system of claim 1, wherein the heat sink abuts the chip by the opening.

11. A computer system comprising:
a chassis;
a motherboard secured to the chassis; a chip mounted on the motherboard; the motherboard defining a positioning post adjacent the chip; a securing component secured to the motherboard and surrounding the chip; the securing component defining an opening and a positioning hole; and
a heat sink comprising a main body abutting the chip by the opening, and a fin portion located on the main body; the main body defining a through hole; the fin portion defining a recess to expose the through hole; wherein
the heat sink is secured to the securing component, by a fastener engaged in the through hole, the positioning hole and the positioning post.

12. The computer system of claim 11, wherein a fastener hole is defined in the positioning post.

13. The computer system of claim 11, wherein the positioning post extends into the positioning hole.

14. The computer system of claim 11, wherein a flange extends downward from edge of the positioning hole.

15. The computer system of claim 14, wherein the flange is adjacent the motherboard.

16. The computer system of claim 14, wherein the flange surrounds the positioning post.

17. The computer system of claim 11, wherein the positioning hole communicates with the opening.

18. The computer system of claim 11, wherein the fastener comprises a bolt and a spring surrounding the bolt; and the spring are located in the recess.

19. The computer system of claim 18, wherein the spring is resiliently deformed to press the main body of the heat sink.

* * * * *